United States Patent [19]

Saadoun

[11] Patent Number: 5,631,714
[45] Date of Patent: May 20, 1997

[54] APPARATUS FOR AUTOMATICALLY ADAPTING THE MEAN SOUND LEVEL OF A TELEVISION RECEIVER

[75] Inventor: Serge Saadoun, 24bis Avenue, du Général de Gaulle, France

[73] Assignee: Serge Saadoun, Soissons, France

[21] Appl. No.: 561,737

[22] Filed: Nov. 22, 1995

[30] Foreign Application Priority Data

Nov. 23, 1994 [WO] WIPO ............... PCT/FR94/01366

[51] Int. Cl.⁶ ..................................................... H04N 5/60
[52] U.S. Cl. ..................... 348/738; 348/736; 381/101; 381/104; 455/200.1; 455/267
[58] Field of Search .................... 455/200.1, 233.1, 455/267; 381/101–104; 348/736, 738; H04N 5/60

[56] References Cited

U.S. PATENT DOCUMENTS

| Re. 33,535 | 2/1991 | Cooper ........................... 348/738 |
| 3,875,521 | 4/1975 | Kikuchi et al. . |
| 3,904,971 | 9/1975 | Delagrange . |
| 4,625,240 | 11/1986 | Yablonski et al. ................ 348/738 |
| 5,363,147 | 11/1994 | Joseph et al. .................... 348/738 |

FOREIGN PATENT DOCUMENTS

| 0512374 | 11/1992 | European Pat. Off. . |
| 2594609 | 8/1987 | France . |
| 4007572 | 11/1990 | Germany . |
| 4136471 | 5/1992 | Germany . |
| 4237005 | 5/1994 | Germany . |

OTHER PUBLICATIONS

Patent Abstracts of Japan, vol. 18 No. 161 (E–1526), 17 Mars 1994 & JP,A,05 335854 (Watanabe Yoshiharu et al.) 17 Décembre 1993, voir abrégé.

Patent Abstracts of Japan, vol. 11 No. 351 (E[557], 17 Novembre 1987 & JP,A 62 130084 (Fujitsu General Ltd) 12 Juin 1987, voir abrégé.

Patent Abstracts of Japan, vol. 16 No. 224 (E–1206), 25 Mai 1992 & JP,A, 04 040082 (Mitsubishi Electric Corp) 10 Fevrier 1992, voir abrégé.

Patent Abstracts of Japan, vol. 14 No. 553 (E–1010), 7 Décembre 1990 & JP,A,02 238727 (Pioneer Electron Corp) 21 Septembre 1990, voir abrégé.

Patent Abstracts of Japan, vol. 14 No. 553 (E–10100, 7 Décembre 1990 & JP,A,02 238704 (Pioneer Electron Corp) 21 Septembre 1990, voir abrégé.

*Primary Examiner*—Glenton B. Burgess
*Attorney, Agent, or Firm*—Lowe, Price, LeBlanc & Becker

[57] ABSTRACT

A system for automatically adapting the mean sound level of a television receiver. The system for automatically adapting the mean sound level of a television receiver comprises an adapting module comprising both a video adapting circuit comprising at least one additional input highpass filter and a fixed-gain video amplifier connected in series and interposed in the video image processing circuits at circuity for providing video image signals, and secondly an audio adapting circuit interposed in the sound path at circuity for taking audio signals to detect the input mean level of sound, to compare said mean level of sound with a pre-established reference mean level, and automatically to adapt the mean level of output sound to maintain it at the pro-established reference mean level.

17 Claims, 4 Drawing Sheets

APPARATUS FOR AUTOMATICALLY ADAPTING THE MEAN SOUND LEVEL OF A TELEVISION RECEIVER

The present invention provides an apparatus for automatically adapting the mean sound level of a television receiver fitted both with means for delivering audio signals detected within at least one sound path of a composite video signal and means for delivering video image signals detected from said composite video signal.

BACKGROUND OF THE INVENTION

Various systems have already been proposed for automatically adapting the mean sound level of radio receivers, in particular of radio broadcast receivers located on-board motor vehicles, specifically for the purpose of adapting the sound volume to the ambient noise level. Those systems act by responding to noise sources that are external to the receiver.

With television receivers, whether monochrome or color, monophonic or stereophonic, and in particular with domestic receivers, the problem for viewer comfort is generally not associated with noise from the surroundings, particularly since it is possible to eliminate such noise, e.g. by wearing headphones. contrast, the viewer generally finds that on changing channel, the mean sound level usually varies, which means that the sound volume must be adapted on each occasion.

Even with a remote control, it is disagreeable for a viewer who is "channel punching", i.e. skipping frequently from one program to another, to have to adapt the mean sound level manually by means of the manual control for adjusting volume.

Even more difficult is the observation that for any one channel selected by the viewer, the mean sound level often varies over a wide range. Thus, when broadcasting advertising sequences or signature tunes at the beginning or the end of broadcasting, the mean sound level is generally higher than within a normal program, such as a broadcast based on speech. Musical programs can also give rise to highly contrasted sound levels, generally greater than those of broadcasts based on conversation or on reporting.

There is thus a need for a system enabling the sound volume of broadcast programs to be equalized automatically.

Unfortunately, in practice, there is a difficulty associated with the fact that the sound is not transmitted completely independently of the image. Thus any action taken on the audio path has repercussions to a greater or lesser extent on image quality, particularly if synchronization signals are degraded, and conversely image processing does not provide a way of solving problems associated with sound quality.

Thus, the automatic gain control (AGC) systems of television receivers act only on the image itself, and do not act on the audio paths to provide an equalization function.

Also, the number of existing television receivers is very large and it would be desirable for means for automatically equalizing sound volume to be capable of being applied to receivers that are already in operation and that do not have such means.

OBJECTS AND SUMMARY OF THE INVENTION

An object of the invention is thus to remedy the drawbacks of the prior art as explained above, and to enable a given mean sound level to be maintained automatically at a pre-established level, whatever channel has been selected, and once a channel has been selected, whatever the type of broadcast, including advertising.

Another object of the invention is to provide a system for automatically adapting mean sound level that is capable of being applied equally well to television receivers that are already in service and to newly-designed television receivers, and without degrading the quality of the image received simultaneously with the sound.

Another object of the invention is to provide a system which is easy and cheap to manufacture, and in particular a modular system which can be installed by viewers themselves without it being necessary for them to have specialized technical knowledge.

These objects are achieved by a system for automatically adapting the mean sound level of a television receiver fitted both with means for delivering audio signals detected within at least one sound path of a composite video signal and means for delivering video image signals detected from said composite video signal, comprising an adapting module comprising both a video adapting circuit comprising at least one additional input highpass filter and fixed-gain video amplifier connected in series and interposed in the video image processing circuits at said means for providing video image signals, and secondly in audio adapting circuit interposed in said sound path at said means for providing audio signals, to detect the mean sound input level, to compare said mean sound level with a pre-established reference mean level, and automatically to adapt the output mean sound level to maintain it at said pre-established reference mean level.

In a particular embodiment, the circuit for automatically adapting the mean sound level comprises an input highpass filter followed by an input lowpass filter then by a comparator-amplifier circuit and an output lowpass filter, the comparator-amplifter circuit being associated with a limiter circuit and a feedback loop acting at the output of said input lowpass filter.

More particularly, the limiter circuit comprises a first transistor and the feedback loop comprises a second transistor.

In a particular application that enables the system to be made completely modular, said means for providing audio signals and video image signals comprise a first standardized connector and a second standardized connector having said adapting module connected thereto.

In which case, more particularly, each of the standardized first and second connectors has a slow switching terminal, the slow switching terminal of the first standardized connector is connected to a DC power supply defining a high level, the slow switching terminal of the second standardized connector is connected to a circuit for controlling a relay for switching at least a first contact between an input of the adapting circuit and one or other of the input and output terminals of an audio path of the second standardized connector and at least one second contact between a video input terminal of the standardized first connector and one or other of terminals internal to the adapting module and connected via said video adapting circuit respectively to a video input terminal of the second standardized connector and to a video output terminal of the first standardized connector.

In a possible embodiment, said video adapting circuit comprises a first input highpass filter and a first fixed-gain video amplifier connected between the video output terminal of the first standardized connector and one of said internal terminals, a second input highpass filter and a second fixed-gain video amplifier connected between the video input terminal of the second standardized connector and the other of said internal terminals, and a third video amplifier connected between the point common to the first highpass filter and the first video amplifier and a video output terminal of the second standardized connector.

The system may include a closed box containing said adapting module, with said first and second standardized connectors being mounted on two opposite faces of said box, thereby enabling modular connection to a television receiver set or to auxiliary apparatus for processing composite video signals, such as a video recorder.

In a possible particular embodiment, the system comprises means for operating whenever an auxiliary apparatus is connected to said second standardized connector, to selectively connect the slow switching terminal of the second standardized connector to a DC power supply defining a high level.

In another embodiment, the system may alternatively be incorporated in an electronic circuit card within a television receiver.

BRIEF DESCRIPTION OF THE DRAWINGS

Other characteristics and advantages of the invention appear from the following description of particular embodiments, given as examples and described with reference to the accompanying drawings, in which.

MORE DETAILED DESCRIPTION

Figure 1:
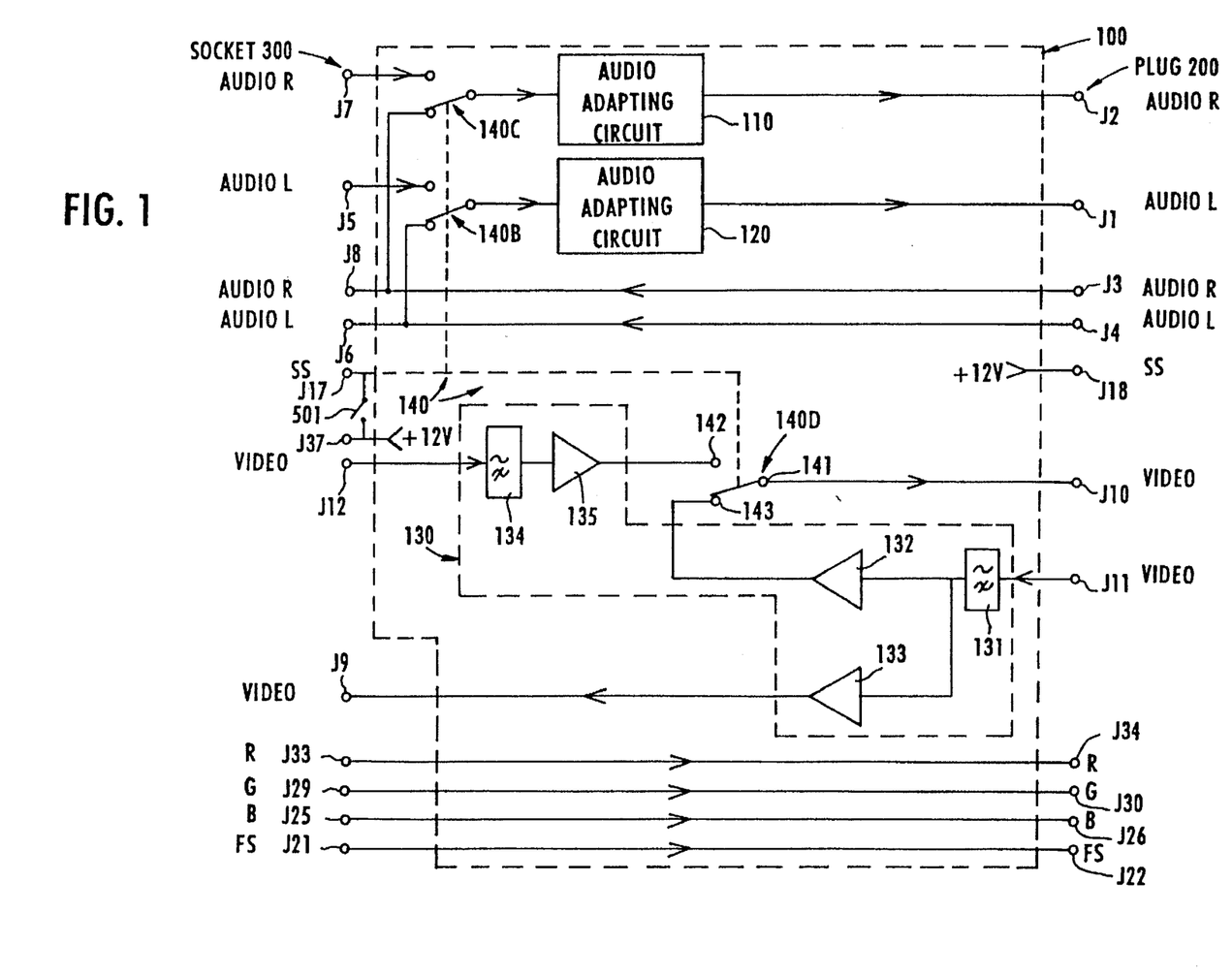
FIG. 1 is a block diagram showing the essential elements of a system of the invention for automatically adapting the mean sound level of a television receiver.
Figure 3:
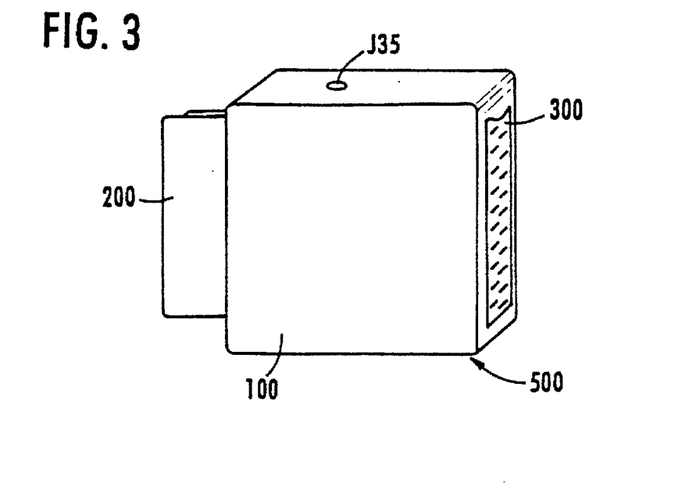
FIG. 3 is a perspective view of en example of a system of the invention implemented in modular manner.

With reference initially to FIG. 1, there can be seen a block diagram of a module 100 of the invention for automatically adapting mean sound level and associated with a standardized male plug 200 of the Peritel type and a standardized female socket 300 of the Peritel type, so as to make it possible for system to be implemented in the form of a modular box, as shown in FIG. 3, suitable for being connected via the male plug 200 to the female Peritel socket of a standard television receiver that may equally well be monochrome or color, and that may be monophonic or stereophonic. The female Peritel socket 300 placed on a face of the module box 100 remote from the male plug 200 ensures that a standard socket is still available after the male plug 200 of the module 100 has been plugged into a television set. The female Peritel socket 300 enables the same functions to be performed as the original female Peritel socket of the television set, e.g. connection to a video recorder, a decoder for encrypted channels, a demodulator for satellite broadcasts, or a games console, for example. Under such circumstances, whatever the auxiliary apparatus used and connected via the female socket 300, the module 100 will continue to perform its function of equalizing sound level.

In FIG. 1, there can be seen some of the connection terminals of the male end female plug and socket 200 and 300 whose functions are the same as those of terminals in standardized Peritel connectors and which perform e special function in the content of the present invention.

Thus, terminals J1 and J2 of the plug 200 correspond to pins 6 and 2 of a Peritel plug and constitute the audio inputs for left and right paths respectively. Terminals J3 and J4 of the plug 200 correspond to pins 1 and 3 of a Peritel connector and constitute audio outputs respectively for the right and left paths. Terminals J10 and J11 of the plug 200 correspond to pins 20 and 19 of a Peritel connector and constitute a video input and a video output respectively, Terminal J18 of the plug 200 corresponds to pin 8 of a Peritel connector and constitutes a terminal for slow switching between TV receiver and Peritel connector. In the module 100 of the invention, this terminal J18 is permanently connected to a high level by connection to a DC voltage source.

In similar manner, terminals J5 and J7 of the socket 300 correspond to pins 6 and 2 of a Peritel connector and constitute audio inputs for the left and right channels respectively. Terminals J8 and J6 of the socket 300 Correspond to pins 1 under of a Peritel connector and constitute the audio outputs for the right and left channels respectively. Terminals J12 and J9 of the socket 300 correspond to pine 20 and 19 of a Peritel connector and constitute s video input and a video output respectively. Terminal J17 of the socket 300 corresponds to pin 8 of a Peritel connector and constitutes a terminal for slow switching between a TV receiver and the Peritel connector.

Figure 2:
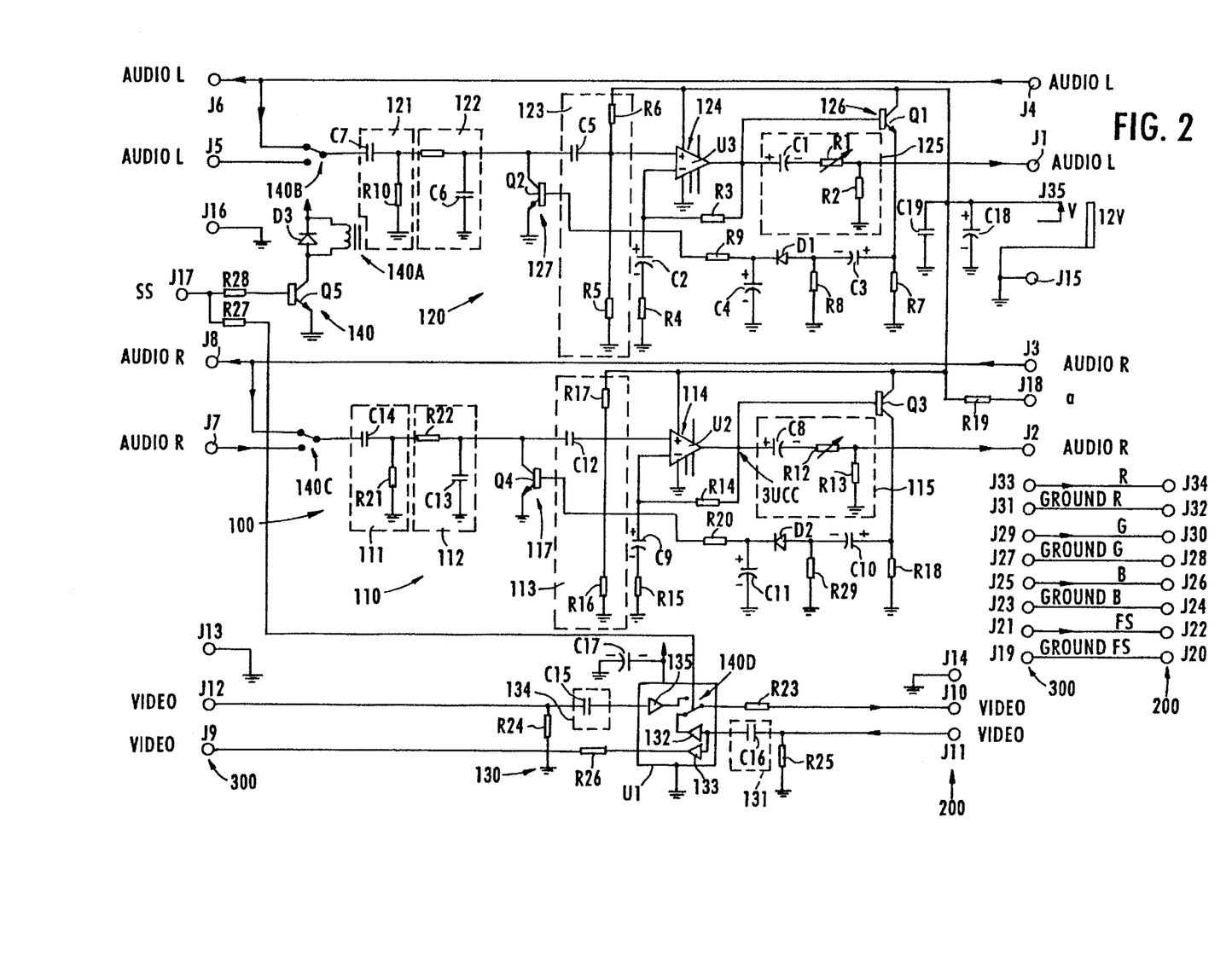
FIG. 2 is a detailed circuit diagram of a particular embodiment of FIG. 1 system.

In the detailed circuit of FIG. 2, there can be seen other terminals J15 and J14 of the plug 200 which constitute audio and video ground terminals and correspond to pins 4 and 17 of a Peritel connector. Similarly, terminals J16 and J13 of the socket 300 constitute the audio and video ground pins.

In FIG. 1 and/or FIG. 2, there are shown other terminals J34, J32, J30, J28, J26, J24, J22, J20 of the plug 200 which are connected directly to corresponding terminals J33, J31, J39, J27, J25, J23, J21, and J19 respectively of the socket 300 and correspond respectively to pins 15, 13, 11, 9, 7, 5, 16, and 18 of a Peritel connector (having the following functions: red, red ground, green, green ground, blue, blue ground, quick switching input, quick switching ground). These terminals which have no special function in the context of the present invention are directly interconnected between the plug 200 and the socket 300, with the module 100 being entirely transparent for signals applied to these pins.

As can be seen in FIG. 1, the adapting module 100 directly interconnects the terminals J3 and J4 of the plug 200 with respective terminals J8 and J6 of the socket 300.

In contrast, socket terminals J8 and J6 or J7 and J5 are connected to plug terminals J2 and J1 respectively in selective manner via respective relay contacts 140C and 140B and respective audio adapting circuits 110 and 120. In FIGS. 1 and 2, the relay contacts 140C and 140B are shown in their positions where they connect the terminals J2 and J1 to the terminals J8 and J6 respectively.

Terminals J10 and J11 of the plug 200 and terminals J12 and J9 of the socket 300 are interconnected via a video adapting circuit 130 and a relay contact 140D.

More particularly, in the configuration of FIG. 1, video output terminal J11 of the plug 200 is connected to a highpass filter 131 itself connected to the inputs of video amplifiers 132 and 133 of fixed gain. The output of amplifier 133 is connected to video output terminal J9 of the socket 300 while the output of amplifier 132 is connected to a contact terminal 143 internal to the module 100 and then via relay contact 140D hinged on internal terminal 141 to terminal J10 of the plug 200.

Video input terminal J12 of the socket 300 is connected to a highpass filter 134, itself connected to the input of a fixed-gain video amplifier 135 identical to the amplifiers 132 and 133 and having its output connected to an internal contact terminal 140 within the module 100. When the contact 140D is in its position opposite to the position shown in FIGS. 1 and 2, terminal J12 is connected to terminal J10 via the highpass filter 134 and the amplifier 135.

Terminal J17 of the socket 300 powers the control elements of the relay(s) for switching the contacts 140B, 140C, and 140D. In FIGS. 1 and 2, the contacts 140B, 140C, and 140D are shown in their rest positions corresponding to a low level signal on terminal J17, i.e. in the absence of any auxiliary apparatus connected to the socket 300. Under such circumstances, the video output signal present on terminal J11 is reapplied to video input signal J10 of plug 200 after passing through the highpass filter 131, the amplifier 132, and the contact 140D. Similarly, the audio output signals of terminals J3 and J4 are reapplied to audio input terminals J2 and J1 respectively of the right and left paths of stereo audio paths after each has passed through a respective contact 140C or 140B and a respective audio adapting circuit 110 and 120.

When un auxiliary apparatus is securely connected to the socket 300, terminal J17 receives a high level signal ("1") which activates the relay 140 as represented by dashed lines in FIG. 1, thereby switching over the contacts 140C, 140B, and 140D. In this new position, video input terminal J12 is connected to video input terminal J10 via the highpass filter 134, the amplifier 135, and the contact 140D. Whatever video input/output terminals J12, J9, J10, or J11 are in use, there is thus always a series circuit constituted by a highpass filter and an amplifier providing a small amount of gain to avoid level deformation appearing in the video signal, particularly in the synchronizing signals, regardless of any treatment performed in the audio adapting circuits 110 and 120, and the function of the slow switching terminal J17 for switching auxiliary devices is conserved in spite of the terminal J18 of the plug 200 being permanently held at a high level.

It will also be observed that in the excitation position of the relay 140, the audio input terminals J7 and J5 are connected to audio input terminals J2 and J1 of the plug 200 by the audio adapting circuits 110 and 120 which can thus perform their sound level equalizing function in both the left and the right paths equally well when the audio signals come from an external source connected to the socket 300 (e.g. a video recorder, a video camera, a decoder, a demodulator, . . . ).

A particular embodiment of a module 100 is described below with reference to FIG. 2. This module includes audio adapting circuits 110 and 120 ensuring that a compressed signal is available under all circumstances on the right and left audio input terminals J2 and J1, and a proper non-attenuated and non-deformed video signal is always available on video input terminal J10 of plug 200, which video signal has kept its line and frame synchronizing pulses intact.

In the embodiment of FIG. 2, the identical fixed-gain amplifiers 132, 133, and 135 are combined within a single integrated circuit U1 which constitutes a video switch and also contains the contact 140D together with its terminals 141, 142, and 143 and its excitation member connected via an external resistor R27 to terminal J17 of the socket 300. The Vcc terminal of the circuit U1 is connected to the power supply and is also connected to a capacitor C17 whose other plate is connected to ground. The highpass filters 131 and 134 essentially comprise respective capacitors C16 and C15. Each terminal J11 and J12 is also connected to a respective resistor R25, R24 whose other end is connected to ground. The output amplifier 135 in circuit U1 is also connected to terminal J9 via a resistor R26.

The coil 140A of relay 140, connected in parallel with a diode D3, is mounted in the collector circuit of a transistor Q5 whose emitter is connected to ground and whose base is connected via a resistor R28 to the slow switching terminal J17.

FIG. 2 shows a connector J35 for connection to an external DC power supply, e.g. at 12 volts, which may be a conventional power supply connected to mains, for example. The connector J35 is connected to ground by capacitors C18 and C19, and to the terminal J18 by a resistor R19, Slow switching terminal J18 of the plug 200 is thus permanently maintained at a "1" level.

The particular structure of the audio adapting circuits 110 and 120 for the right and left paths of a stereo sound system is now described. Both audio adapting circuits 110 and 120 are completely identical so they are both described together.

Contact 140B (140C) of relay 140 is connected via its fixed point to an input highpass filter 121 (111) having an RC circuit made up of a capacitor C7 and a resistor R10 (C14, R21). The highpass filter 121 (111) is followed by a lowpass filter 122 (112) comprising an RC circuit made up of a resistor R11 and a capacitor C6 (R22, C13). The collector-emitter circuit of a transistor Q2 (Q4) constitutes a member for compressing the signal 127 (117) and is connected in parallel with the capacitor C6 (C13) of the lowpass filter 122 (112). The base of transistor Q2 (Q4) is itself controlled by a feedback circuit described below.

The output of lowpass filter 122 (112) is connected via a coupling capacitor C5 (C12) to a circuit 123 (113) defining the low frequency gain of amplifier 124 (114) constituted by an operational amplifier U3 (U2). The circuit 123 (113) essentially comprises resistors R5, R6 (R16, R17).

The output of amplifier U3 (U2) is connected via a resistor R3 (R4) to the inverting input of amplifier U3 (U2). The inverting input of amplifier U3 (U2) is also connected to ground via a series circuit constituted by capacitor C2 and resistor R4 (C9, R15). The non-inverting input of amplifier U3 (U2) is connected to the common point between resistors R6 and R5 (R17 and R16) connected in series between the power supply of terminal J35 and ground.

The output of amplifier U3 (U2) is connected to the audio input terminal J1 (J2) via a lowpass filter 125 (115) comprising a capacitor C1 (C8), an adjustable resistor R1 (R12), and a resistor R2 (R13) connected between the output of the filter 125 (115) and ground. The adjustable resistor R1 (R12) serves to adjust the mean level of the signal on terminal J1

(J2), i.e. it serves to adapt the magnitude of the compression and the pre-established reference mean level to which the mean level of the sound maintained at the output from the audio adapting circuit 110 (120).

Naturally, the resistor R1 (R12) could be selected to have a value that is fixed once and forever. In which case, the re-established reference mean level determining the mean level of sound at the output from the audio adapting circuit 110 (120) is set by construction, but the user can still modify the equalized mean level of sound by acting on the volume control button of the television receiver or the remote control keypad, providing volume adjustment is performed by adjusting the gain of a low frequency amplifier situated on the audio paths downstream from the adapting module 100.

The output of operational amplifier U3 (U2) conserves a substantially constant mean signal level because of the presence of transistor Q1 (Q3) whose base is connected to the output of operational amplifier U3 (U2), whose collector is connected to DC power supply terminal J35 and whose emitter is connected via resistor R7 (R18) to ground. The emitter of transistor Q1 (Q3) is connected via a capacitor C3 (C10), a diode D1 (D2), and a resistor R9 (R20) to the base of transistor Q2 (Q4). A resistor R8 (R29) connected between the common point between capacitor C3 (C10) and diode D1 (D2) to ground. A capacitor C4 (C11) is connected between the common point of diode D1 (D2) and resistor R9 (R20) to ground.

When the output signal from operational amplifier U3 (U) tends to increase beyond a predetermined threshold defined by the components associated with the operational amplifier U3 (U2), then transistor Q1 (Q3) becomes conductive and the positive voltage across the terminals of resistor R7 (R18) via the feedback connection to the base of transistor (Q4) causes the transistor Q2 (Q4) to conduct. In combination with capacitor C8 (C13) transistor Q2 (Q4) compresses the signal at the input to amplifier 124 (114), thereby contributing to bringing the output of operational amplifier U3 (U2) to the pre-established level and to causing transistor Q1 (Q3) to switch off again, thereby switching off transistor Q2 (Q4) and removing the compression effect at the input of amplifier 124 (114) until transistor Q1 (Q3) becomes conductive again in the event of the mean level of the input signal of amplifier 124 (114) increasing again.

By way of non-limiting example, the system in the embodiment described above can accept a maximum input voltage of 40 Vcc, can operate with a normal input voltage in operation on audio output terminals J3 and J4 of plug 200 at 100 mVrms on 1k_, and a regulated mean output level comprising a compressed signal of 80 mVrms on 1k_. By way of example the passband may be 20 kHz to 40 kHz at 0 dB. The output signal level from circuit U2 (U3) may, for example, be about 3 Vcc.

Figure 4:
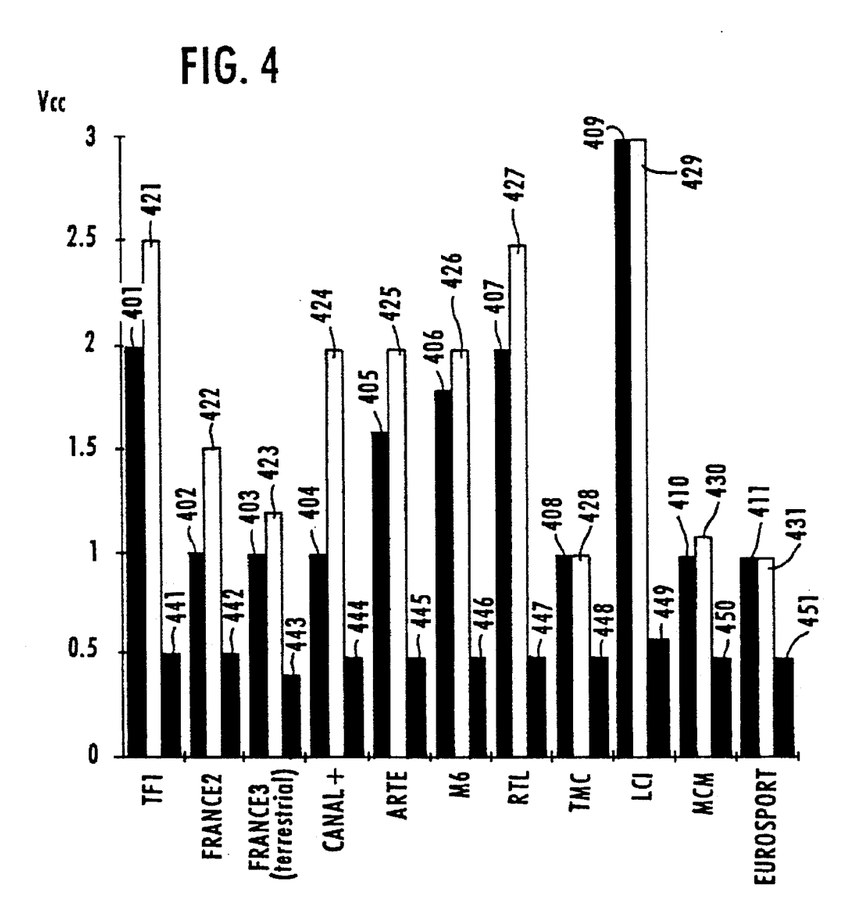
FIG. 4 is a histogram showing the mean sound levels of e television receiver for various broadcast channels, firstly for a normal program and secondly for a program of increased sound level (advertising) in the absence of a system of the invention, and thirdly in the presence of the system of the invention.

For various television channels received in France, FIG. 4 is a histogram comparing the mean voltage levels of the audio path signals received by satellite and applied to the input of a system of the invention (terminals J3 and J4 of the plug 200) firstly, while ordinary programs are being broadcast (references 401 to 411) and secondly, while advertising is being broadcast (references 421 to 431). Thirdly, they show the audio signals available at the output of the system of the invention on terminals J2 and J1 of the plug 200 (references 4441 to 451) for each of the channels concerned (TF1, France 2, terrestrial France 3, Canal+, Arte, M6, RTL, TMC,LCI, MCM, and Eurosport) regardless of the type of program being broadcast (ordinary program or advertising).

Off air, the differences in mean sound level between channels can vary over the range 1 to 3 (1 $V_{cc}$ on TMC to 3 $V_{cc}$ on LCI), with fluctuations within a single channel (e.g. Canal+) that can vary in the range 1 to 2 (1 Vcc to 2 Vcc) on changing between an ordinary broadcast (reference 404) and advertising (reference 424). With the system of the invention, it can be seen that the output levels (referenced 441 to 451) remain close to 0.5 Vcc whichever channel is concerned, and whatever type of program is involved, the maximum difference relative to the mean value applies to two channels only (France 2 with a level of about 0.4 Vcc and LCI with a level of about 0.6 Vcc). It has thus been observed that the system of the invention makes it possible to achieve very considerable equalization, thus reducing inconvenience for the viewer. Naturally, the regulated output level of 0.5 Vcc could be changed, either by acting on the adjustable resistors R1 and R12 or else by acting on the conventional sound volume control of the television set. In either event, the phenomenon of compression and equalization is conserved.

As shown in FIG. 3, the system of the invention may comprise module 100 contained in a box 500, e.g. made of plastics material, and fitted on two opposite faces with standardized Peritel connectors, namely a plug 200 and a socket 300, The box 500 may be small in size and may be associated with an external DC power supply, e. g. connected via connector J35 to the module 100. The box 500 may be compact in shape with only the plug 200 projecting therefrom, the socket being integrated within the wall of the box. The system shown in FIG. 3 can be taken out of operation merely by disconnecting the plug 200 from the television set or merely by turning off the electrical power supply to the connector J35 (either by unplugging the power supply or by using a switch thereon).

The invention is naturally applicable to various environments and the regulator system of the invention may comprise a module 100 as described above together with standardized connectors that are not necessarily or exclusively Peritel connectors.

Thus, the main terminals J1 to J4 and J10, J11 of the plus 200 for connection to the television receiver may be constituted by individual connector plugs, e.g. of the "cinch" type from RCA. Under such circumstances, as can be seen in the embodiments of FIGS. 5 to 7, the main male terminals of the standardized plus 200', 200", or 200''' perform the same functions as in the plug 200 of FIGS. 1 to 3 and are given the same references together with one, two or three prime symbols for the embodiment of FIGS. 5, 6, and 7 respectively.

Similarly, the terminals J5 to J8 and J9, J12 of the socket 300 for connection to auxiliary equipment such as a video recorder may be constituted by individual connection sockets which may likewise be of the "cinch" type from RCA. Under such circumstances, also shown in FIGS. 5 to 7, the main standardized connector terminals 300', 300", 300''' perform the same functions as in the socket 300 of FIG. 1 to 3, and they are given the same references plus one, two or three prime symbols for the embodiment of FIGS. 5, 6, and 7 respectively. It will be observed that depending on the particular type of auxiliary equipment involved, the individual connectors 300', 300", and 300''' may be of the female type (as shown) or of the male type.

Figure 5:
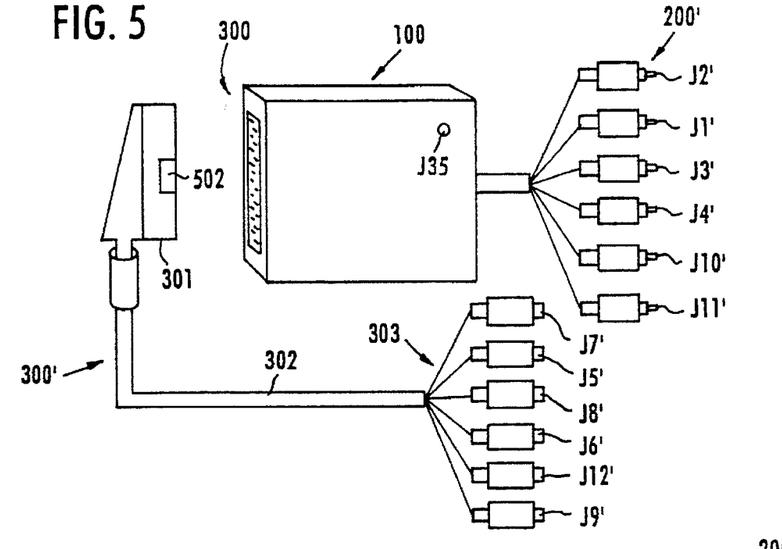
FIG. 5 is a view of a second example of a system of the invention implemented in modular manner.
Figure 6:
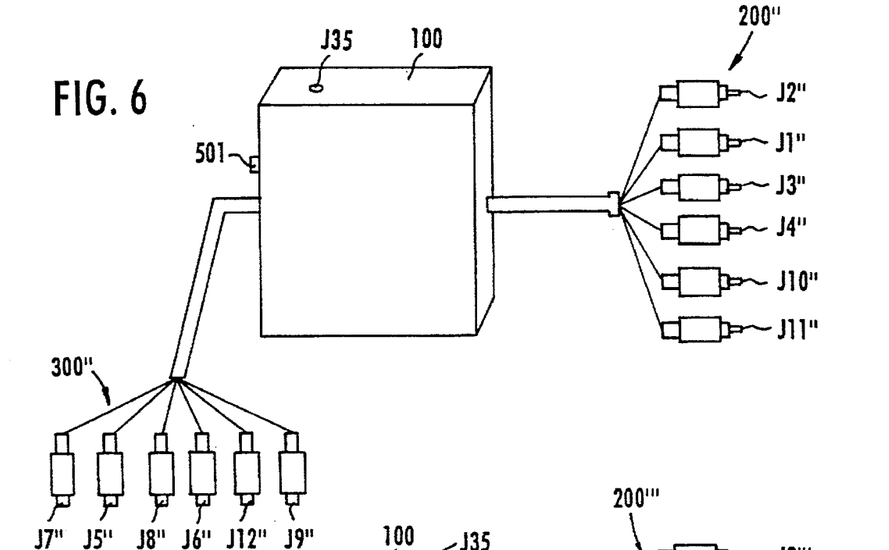
FIG. 6 is a view of a third example of a system of the invention implemented in modular manner.
Figure 7:
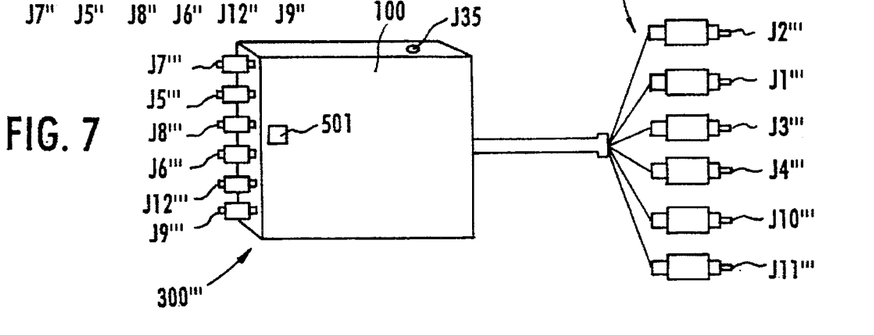
FIG. 7 is a view of a fourth example of a system of the invention implemented in modular manner.

In the embodiments of FIGS. 5 to 7, which are designed for use with television receivers and/or auxiliary equipment not fitted with standardized Peritel type connectors including a slow switching terminal, the absence of such a terminal on the standardized male plug 200', 200", or 200'" is of no consequence since in the module 100 the terminal J18 is held permanently to a high level internally (e.g. as defined by the power supply voltage for the circuits in the module 100).

In contrast, the absence of such a terminal for the standardized connector 300', 300", 300'" must be compensated by adding means for applying a high level signal to connection pin J17 of the module 100 when auxiliary equipment is connected to standardized connector 300', 300", 300'". For this purpose, an additional connection point J37 which receives a high level bias signal, and which may be the same as the signal received by the terminal J18, is provided in the module 100 (FIG. 1). When an auxiliary apparatus is connected, this additional terminal 37 makes it possible to apply a high level signal to the slow switching input terminal J17 of the module 100 by means of an additional control member of the shunt type which may be implemented as a strap 502 (FIG. 5) or as a switch (FIGS. 6 and 7).

FIG. 5 Shows an embodiment in which the module 100 may have a standardized Peritel socket identical to that of the embodiment of FIG. 3. this case, the auxiliary equipment that is not fitted with a Peritel plug can be connected to the set 303 of terminals J5' to J8' and J9', J12' in the form of individual connectors. The set 303 is itself connected by a cord 302 to a Pertitel type plug 301 suitable for plugging into the Peritel socket 300 and additionally having a strap 502 that forms a shunt between male terminals of the Pertitel plug 301 for plugging into the pins J17 and J37 of the Peritel socket 300. As a result, a slow switching signal is automatically presented to terminal J17 of FIG. 1, coming from terminal J37 via the shunt placed in the Peritel plug 301 whenever said plug is in position in the socket 300.

In the embodiment of FIG. 6, the auxiliary equipment is connected to the set 300" of individual type terminals J5" to J8", J9" and J12" which are themselves directly connected to the module 100 via the locations for receiving signals from the pins J5 to J8, J9 and J12 respectively of a Peritel socket 300 when the module 100 is associated with such a socket. addition, a miniature switch 501 makes it possible to provide an electrical connection between connection points J17 and J37 (or J17 and J18) of the module 100 so as to activate the slow switching function on. terminal J17 manually.

The embodiment of FIG. 7 is analogous to that of FIG. 6 except the set 300'" of terminals J'" to J8'", J9'" and J12'" in the form of individual female connectors, e.g. the RCA cinch type, is mounted directly on the box of the module 100 instead of the Peritel socket of FIGS. 3 and 5. The switch 501 perform the same function as in the embodiment of FIG. 6.

It may be observed in the embodiment of FIG. 5 that the set of individual male connectors J1' to J4', J10' and J11' need not be connected directly to the module 100, but could be connected to an intermediate Peritel socket which engages in the Peritel plug 200 of FIG. 3. That makes it possible to use the same basic standard box 500 of FIG. 3 regardless of the type of connection means available on the television set and the auxiliary equipment.

In other possible embodiments, the system of the invention may be implemented permanently directly on an electronic card incorporated in a television set.

It is also possible for the circuits of the adapting module 100 to be integrated in a microprocessor or to form a portion of a masked integrated circuit or to be included in a programmable integrated circuit forming e portion of an electronic card in a television set.

In any event, the system of the invention makes it possible to maintain sound information at pre-established listening level, whatever the selected channel.

When changing channel, the mean sound level remains constant as it does when advertising is being broadcast, where otherwise such differences in sound level are all too perceptible.

The system for automatically adapting mean sound level operates regardless of the sound volume selected by the user by means of a remote control or by acting directly on the television set. The method applies equally to recording on a video recorder or any other recording system.

To switch the system in and out of service, it is possible to provide a special function on the remote control or on the on-screen display system (OSD system) if the adapting module is incorporated on a television set card.

I claim:

1. A system for automatically adapting the mean sound level of a television receiver fitted both with means for delivering audio signals detected within at least one sound path of a composite video signal and means for delivering video image signals detected from said composite video signal, comprising an adapting module comprising both a video adapting circuit comprising at least one additional input highpass filter and fixed-gain video amplifier connected in series and interposed in the video image processing circuits at said means for providing video image signals, and secondly an audio adapting circuit interposed in said sound path at said means for providing audio signals, to detect the mean sound input level, to compare said mean sound level with a pre-established reference mean level, and automatically to adapt the output mean sound level to maintain it at said pre-established reference mean level.

2. A system according to claim 1, wherein the circuit for automatically adapting the mean sound level comprises an input highpass filter followed by an input lowpass filter then by a comparator-amplifier circuit and an output lowpass filter, the comparator-amplifier circuit being associated with a limiter circuit and a feedback loop acting at the output of said input lowpass filter.

3. A system according to claim 2, wherein the limiter circuit comprises a first transistor and the feedback loop comprises a second transistor.

4. A system according to claim 1, wherein said means for providing audio signals and video image signals comprise a first standardized connector and a second standardized connector having said adapting module connected thereto.

5. A system according to claim 4, wherein each of the standardized first and second connectors has a slow switching terminal, wherein the slow switching terminal of the first standardized connector is connected to a DC power supply defining a high level, wherein the slow switching terminal of the second standardized connector is connected to a circuit for controlling a relay for switching at least a first contact between an input of the adapting circuit and one or other of the input and output terminals of an audio path of the second standardized connector and at least one second contact between a video input terminal of the standardized first connector and one or other of terminals internal to the adapting module and connected via said video adapting circuit respectively to a video input terminal of the second standardized connector and to a video output terminal of the first standardized connector.

6. A system according to claim 5, wherein said video adapting circuit comprises a first input highpass filter and a first fixed-gain video amplifier connected between the video output terminal of the first standardized connector and one of said internal terminals, a second input highpass filter and a second fixed-gain video amplifier connected between the video input terminal of the second standardized connector and the other of said internal terminals, and a third video amplifier connected between the point common to the first highpass filter and the first video amplifier and a video output terminal of the second standardized connector.

7. A system according to claim 4, comprising a closed box containing said adapting module, with said first and second standardized connectors being mounted on two opposite faces of said box, thereby enabling modular connection to a television receiver set or to auxiliary apparatus for processing composite video signals.

8. A System according to claim 5, comprising means for operating whenever an auxiliary apparatus is connected to said second standardized connector, to selectively connect the slow switching terminal of the second standardized connector to a DC power supply defining a high level.

9. A system according to claim 1, incorporated on an electronic circuit card inside a television receiver.

10. A system according to claim 1, comprising two audio adapting circuits allocated to the right and left paths of a stereophonic type television receiver.

11. A system according to claim 1, comprising means for selectively putting the adapting module into operation by means of a manual switch or a remote control.

12. A syetem according to claim 1, wherein the circuit for automatically adapting the mean sound level comprises at least one adjustable resistor for adjusting said pre-established reference mean level to which the mean level of sound output from the system in automatically maintained.

13. A system for automatically adapting the mean sound level of a television receiver fitted both with means for delivering audio signals detected within at least one sound path of a composite video signal and means for delivering video image signals detected from said composite video signal, comprising an adapting module comprising both a video adapting circuit comprising at least one additional input highpass filter and fixed-gain video amplifier connected in series and interposed in the video image processing circuits at said means for providing video image signals, and secondly, an audio adapting circuit interposed in said sound path at said means for providing audio signals, to detect the mean sound input level, to compare said mean sound level with a pre-established reference mean level, and automatically to adapt the output mean sound level to maintain it at said pre-established reference mean level, wherein the circuit for automatically adapting the mean sound level comprises an input highpass filter followed by an input lowpass filter then by a comparator-amplifier circuit and an output lowpass filter, the comparator-amplifier circuit being associated with a limiter circuit and a feedback loop acting at the output of said input lowpass filter.

14. A system according to claim 13, wherein the limiter circuit comprises a first transistor and the feedback loop comprises a second transistor.

15. A system for automatically adapting the mean sound level of a television receiver fitted both with means for delivering audio signals detected within at least one sound path of a composite video signal and means for delivering video image signals detected from said composite video signal, comprising an adapting module comprising both a video adapting circuit comprising at least one additional input highpass filter and fixed-gain video amplifier connected in series and interposed in the video image processing circuits at said means for providing video image signals, and secondly, an audio adapting circuit interposed in said sound path at said means for providing audio signals, to detect the mean sound input level, to detect the mean sound input level, to compare said mean sound level with a pre-established reference mean level, and automatically to adapt the output mean sound level to maintain it at said pre-established reference mean level, wherein said means for providing audio signals and video image signals comprise a first standardized connector and a second standardized connector having said adapting module connected thereto, and wherein each of the standardized first and second connectors has a slow switching terminal, wherein the slow switching terminal of the first standardized connector is connected to a DC power supply defining a high level, wherein the slow switching terminal of the second standardized connector is connected to a circuit for controlling a relay for switching at least a first contact between an input of the adapting circuit and one or other of the input and output terminals of an audio path of the second standardized connector and at least one second contact between a video input terminal of the standardized first connector and one or other of terminals internal to the adapting circuit respectively to a video input terminal of the second standardized connector and to a video output terminal of the first standardized connector.

16. A system according to claim 15, wherein said video adapting circuit comprises a first input highpass filter and a first fixed-gain video amplifier connected between the video output terminal of the first standardized connector and one of said internal terminals, a second input highpass filter and a second fixed-gain video amplifier connected between the video input terminal of the second standardized connector and the other of said internal terminals, and a third video amplifier connected between the point common to the first highpass filter and the first video amplifier and a video output terminal of the second standardized connector.

17. A system according to claim 15, comprising means for operating whenever an auxiliary apparatus is connected to said second standardized connector, to selectively connect the slow switching terminal of the second standardized connector to a DC power supply defining a high level.

* * * * *